(12) United States Patent
Lin

(10) Patent No.: US 7,393,728 B2
(45) Date of Patent: Jul. 1, 2008

(54) METHOD OF MANUFACTURING AN ARRAY SUBSTRATE OF A TRANSFLECTIVE LIQUID CRYSTAL DISPLAY

(75) Inventor: Shih-Chieh Lin, Tao Yuan Shien (TW)

(73) Assignee: Au Optronics Corporation, Hsin-Chu (TW)

( * ) Notice: Subject to any disclaimer, the term of this patent is extended or adjusted under 35 U.S.C. 154(b) by 56 days.

(21) Appl. No.: 11/550,040

(22) Filed: Oct. 17, 2006

(65) Prior Publication Data
US 2007/0287235 A1 Dec. 13, 2007

(30) Foreign Application Priority Data
Jun. 13, 2006 (TW) ............................... 95121086 A

(51) Int. Cl.
*H01L 21/00* (2006.01)
*H01L 21/84* (2006.01)

(52) U.S. Cl. .................. 438/149; 438/30; 257/E21.005; 257/E21.023; 257/E21.051; 257/E21.185

(58) Field of Classification Search .................. 438/30, 438/40, 42, 43, 75, 154, 159, 158, 171, 190, 438/187, 149, 197
See application file for complete search history.

(56) References Cited

U.S. PATENT DOCUMENTS

| | | | | |
|---|---|---|---|---|
| 6,888,604 B2 * | 5/2005 | Rho et al. | ..................... | 349/146 |
| 6,897,925 B2 * | 5/2005 | Kim et al. | ..................... | 349/114 |
| 6,919,934 B2 * | 7/2005 | Ha et al. | ..................... | 349/43 |
| 7,046,322 B2 * | 5/2006 | Tsuchiya | ..................... | 349/114 |
| 7,113,238 B2 * | 9/2006 | Okumura | ..................... | 349/114 |
| 7,129,105 B2 * | 10/2006 | Yoon et al. | ..................... | 438/30 |
| 7,141,180 B2 * | 11/2006 | Park et al. | ................... | 252/79.1 |

* cited by examiner

*Primary Examiner*—David Nhu
(74) *Attorney, Agent, or Firm*—Thomas, Kayden, Horstemeyer & Risley

(57) ABSTRACT

A method of manufacturing an array substrate of a transflective liquid crystal display is provided. Utilizing backward exposure and half-tone photo-mask to reduce the number of photo-masks used in the manufacturing process, only three to four photo-masks are used to manufacture a transflective liquid crystal display.

16 Claims, 6 Drawing Sheets

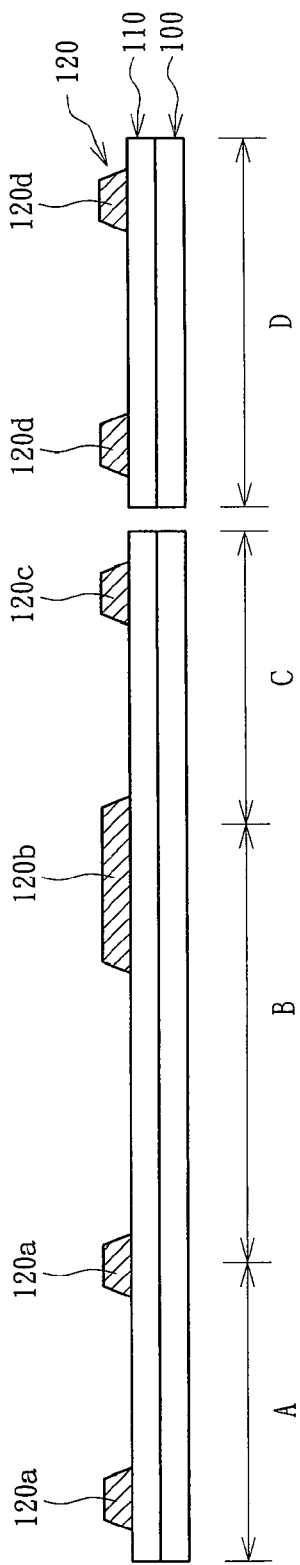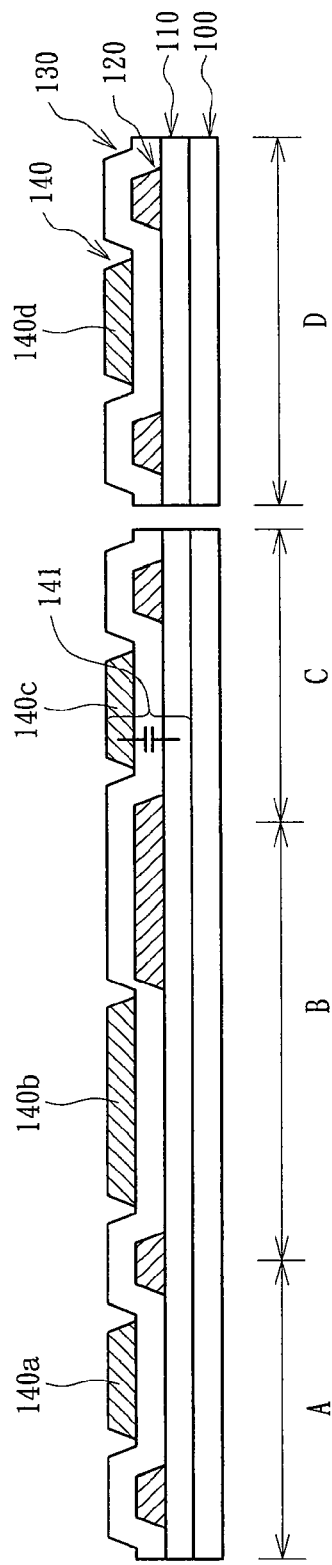
Fig. 1A
Fig. 1B

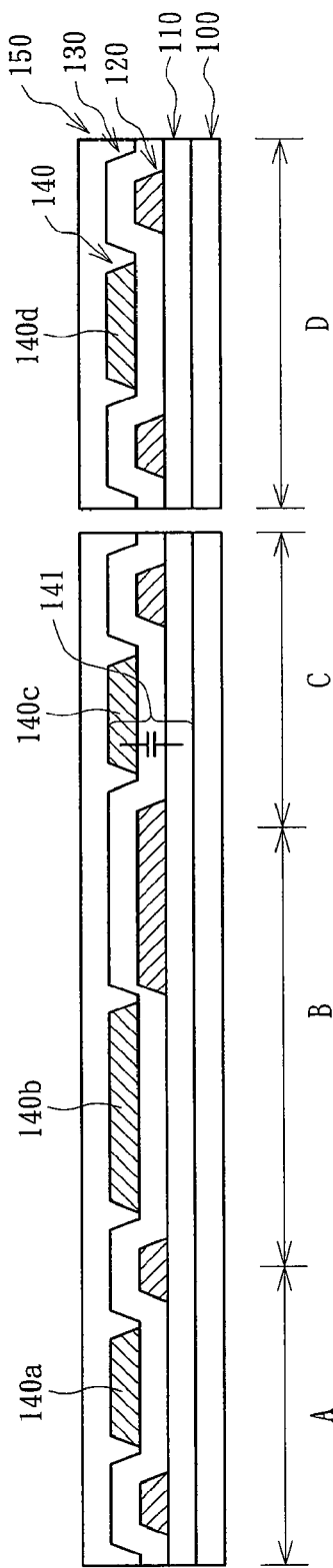
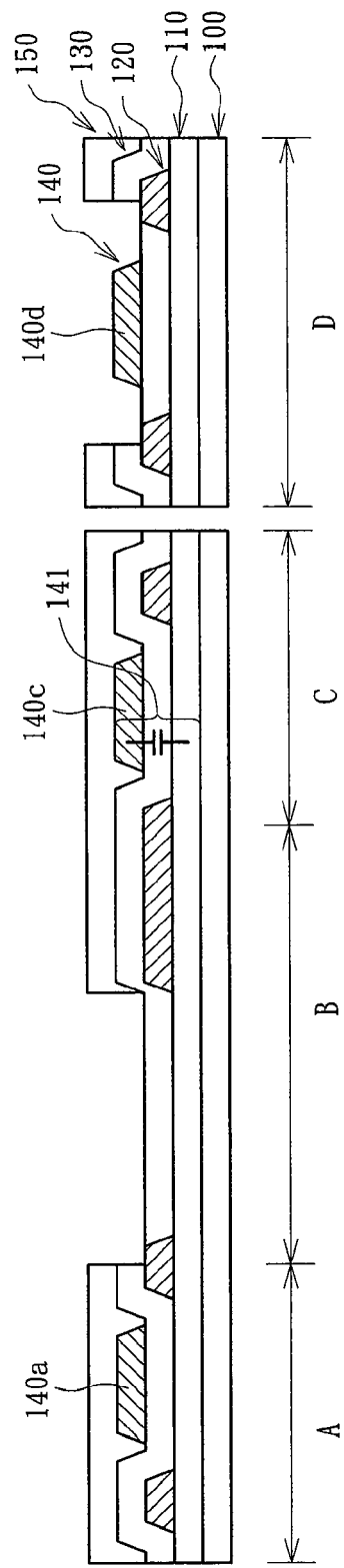
Fig. 1C
Fig. 1D

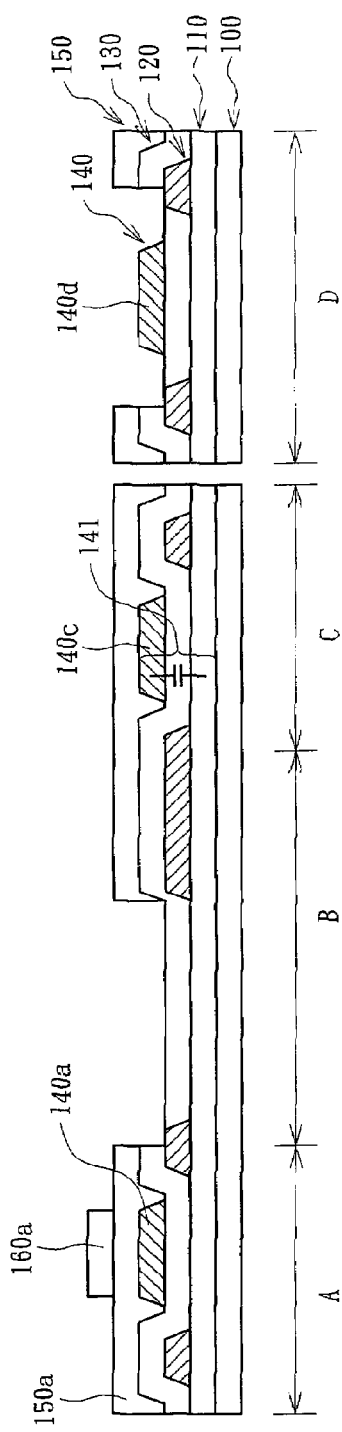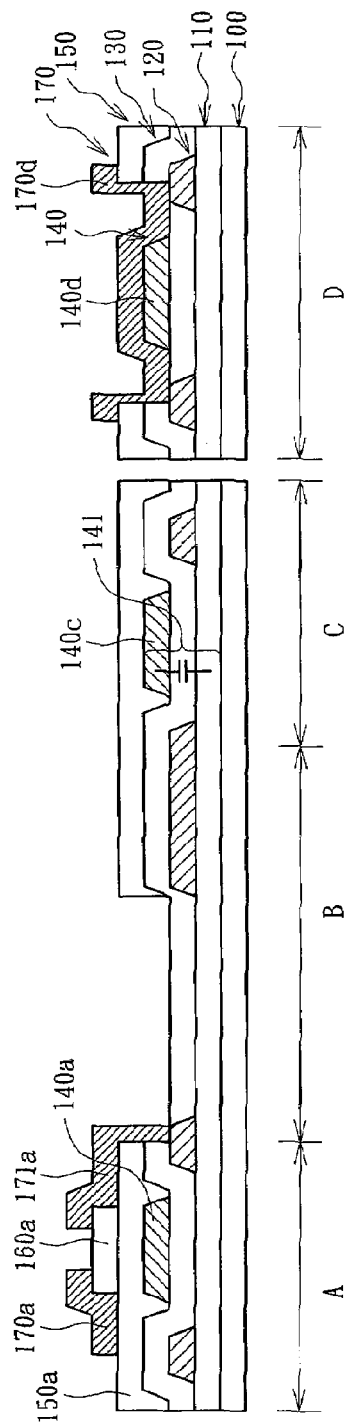

METHOD OF MANUFACTURING AN ARRAY SUBSTRATE OF A TRANSFLECTIVE LIQUID CRYSTAL DISPLAY

RELATED APPLICATIONS

The present application is based on, and claims priority from, Taiwan Application Serial Number 95121086, filed Jun. 13, 2006, the disclosure of which is hereby incorporated by reference herein in its entirety.

BACKGROUND

1. Field of Invention

The present invention relates to a method of manufacturing an array substrate of a liquid crystal display (LCD). More particularly, the present invention relates to a method of manufacturing an array substrate of a transflective LCD.

2. Description of Related Art

Recently, the progress of opto-electronic technology and the rapid development of digital technology push forward the expansion of the LCD market. Because the LCD has many advantages such as high display quality, small size, light weight, low driving voltage and low power consumption, it has been widely applied to many electronics products such as PDAs, mobile phones, digital videos, notebooks, desk-top displays, digital cameras and projection TVs. Nowadays, LCDs are gradually replacing traditional cathode ray tube (CRT) displays and becoming the mainstream product in the display market.

The manufacturing processes of manufacturing an array substrate of a LCD mainly comprise three kinds of different manufacturing processes, the deposition process, the lithography process and the etching process. Among these processes, the lithography process has the highest production cost. Therefore, many LCD manufacturers tried to reduce LCD production cost by reducing the number of photo-masks needed in the lithography process.

SUMMARY

It is therefore an aspect of the present invention to provide a method of manufacturing an array substrate of a transflective liquid crystal display. This method only uses three to four photo-masks to manufacture transflective LCDs.

In accordance with the foregoing and other aspects of the present invention, a method of manufacturing an array substrate of a transflective LCD is provided. Firstly, a transparent conductive layer and a first metal layer are sequentially formed on a substrate. Secondly, the first metal layer and the transparent conductive layer are defined to allow the first metal layer to form complementary patterns of a gate electrode, a first conducting wire, a capacitance line and a penetrating region of a pixel region and to allow the transparent conductive layer to form a pixel electrode. Thirdly, a first passivation layer and a second metal layer are sequentially formed on the substrate. Fourthly, the second metal layer is defined to form the gate electrode, the first conducting wire and the capacitance line. The capacitance line, and the first passivation layer and the transparent conductive layer constitute a storage capacitance. Fifthly, a dielectric layer is formed on the substrate. Sixthly, the dielectric layer and the second metal layer on a penetrating region of the pixel region, the first passivation layer on sides of the penetrating region and the first passivation layer surrounding an end of the first conductive line are removed. Seventhly, a channel region is formed on the dielectric layer on the gate electrode. Eighthly, a third metal layer is formed on the substrate. Ninthly, the third metal layer is defined to form a second conductive line, a source electrode and a drain electrode. The source electrode and the drain electrode are at two sides of the channel region. The drain electrode is electrically connected to the transparent conductive layer. Tenthly, a second passivation layer is formed on the substrate. Finally, the second passivation layer and the first passivation layer are defined to remove the second passivation layer and the first passivation layer on the penetrating region on the pixel region.

In a preferred embodiment of the present invention, the step of defining the first metal layer and the transparent conductive layer is performed by using a half-tone photo-mask. The second metal layer is defined by backward exposure. The step of removing the dielectric layer and the second metal layer on the penetrating region of the pixel region is performed by using a half-tone photo-mask. The second passivation layer and the first passivation layer are defined by backward exposure.

In accordance with the foregoing and other aspects of the present invention, a method of manufacturing an array substrate of a transflective LCD is provided. Firstly, a transparent conductive layer and a first metal layer are sequentially formed on a substrate. Secondly, the first metal layer and the transparent conductive layer are defined to allow the first metal layer to form complementary patterns of a gate electrode, a first conducting wire, a capacitance line and a penetrating region of a pixel region and to allow the transparent conductive layer to form a pixel electrode. Thirdly, a first passivation layer and a second metal layer are sequentially formed on the substrate. Fourthly, the second metal layer is defined to form the gate electrode, the first conducting wire and the capacitance line. The capacitance line, and the first passivation layer and the transparent conductive layer constitute a storage capacitance. Fifthly, a dielectric layer and a semiconductor layer are formed on the substrate. Sixthly, the semiconductor layer, the dielectric layer and the second metal layer on a penetrating region of the pixel region, the first passivation layer on sides of the penetrating region, the semiconductor layer, the dielectric layer and the first passivation layer surrounding an end of the first conductive line are removed. At the same time, a channel region is formed on the dielectric layer on the gate electrode. Seventhly, a third metal layer is formed on the substrate. Eighthly, the third metal layer is defined to form a second conductive line, a source electrode and a drain electrode. The source electrode and the drain electrode are at two sides of the channel region. The drain electrode is electrically connected to the transparent conductive layer. Ninthly, a second passivation layer is formed on the substrate. Finally, the second passivation layer and the first passivation layer are defined to remove the second passivation layer and the first passivation layer on the penetrating region on the pixel region.

In another preferred embodiment of the present invention, the step of defining the first metal layer and the transparent conductive layer is performed by using a half-tone photo-mask. The second metal layer is defined by backward exposure. The step of removing the semiconductor layer, dielectric layer and the second metal layer on the penetrating region of the pixel region is performed by using a half-tone photo-mask. The second passivation layer and the first passivation layer are defined by backward exposure.

In according to the present invention, half-tone photo-masks and back exposures are used to reduce the number of photo-masks needed in the lithography process. Therefore, only three to four photo-masks are needed in manufacturing a transflective LCD. Besides, The storage capacitances connect in series, not only the capacitance value per unit of area can be increased but also the overall area on the substrate occupied by the storage capacitance can be reduced. Moreover, the aperture rate of the penetrating region of the pixel region and the brightness of the LCD are increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A-1G are cross-section views of an array substrate of a transflective LCD in process steps according to the first embodiment.

DESCRIPTION OF THE PREFERRED EMBODIMENTS

First Embodiment

Figure 1G:
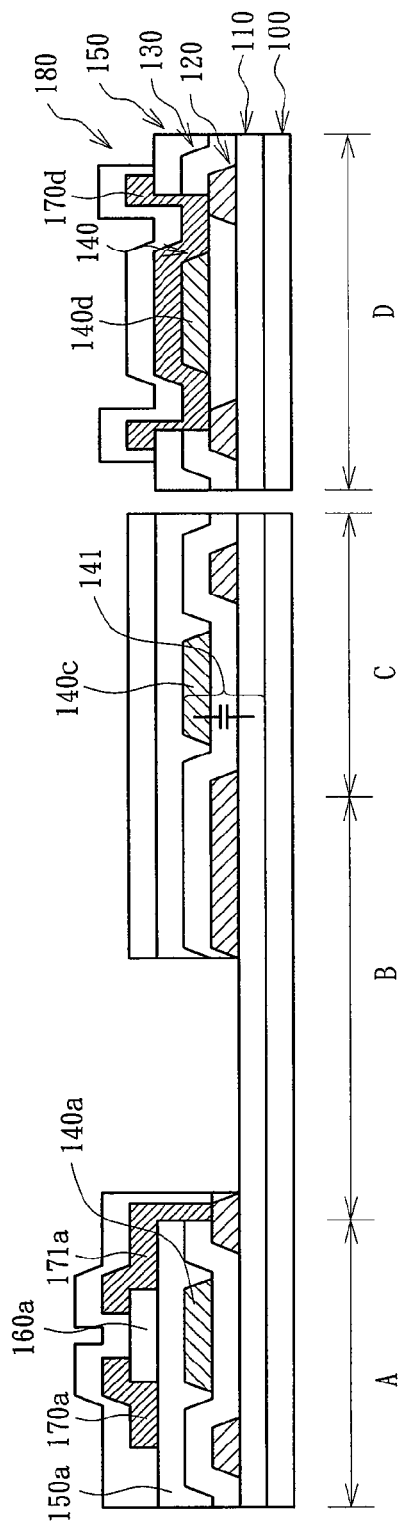

FIGS. 1A-1G are cross-section views of an array substrate of a transflective LCD in process steps according to the first embodiment of the present invention. In FIG. 1A, regions from left to right are a thin film transistor (TFT) region A, a pixel region B, a storage capacitance region C and a gate pad region D, respectively. First, a transparent conductive layer 110 and a first metal layer 120 are formed sequentially on a substrate 100. Then, a first half-tone photo-mask is used to define the first metal layer 120 and the transparent conductive layer 110 simultaneously. The first metal layer 120 is defined to form complementary patterns 120a, 120c and 120d and a reflective layer 120b, which is on a penetrating portion of the pixel region B. The complementary patterns 120a, 120c and 120d are the complementary patterns of a gate electrode, a capacitance line and a gate pad, respectively. A complementary pattern of a scan line is also formed in the first metal layer 120 but not shown in FIG. 1A. The transparent conductive layer 110 is defined to form a pixel electrode. The first metal layer 120 with complementary patterns of the gate electrode 120a, the capacitance line 120c, the scan line (not shown) and the gate pad 120d is used as a photo-mask for the following backward exposure process. The reflective layer 120b on the penetrating portion of the pixel region B is used to reflect external light which enters into the LCD.

In FIG. 1B, a passivation layer 130 and a second metal layer 140 are sequentially formed on the substrate 100. Then, the first metal layer 120 with complementary patterns is used as a photo-mask to define the second metal layer 140 by means of a backward exposure. Therefore, the second metal layer 140 is defined to form a gate electrode 140a, a capacitance line 140c, a scan line (not shown) and a gate pad 140d. At the same time, a sacrifice metal layer 140b is formed on the penetrating portion of the pixel region B in the second metal layer 140. The capacitance line 140c, the underlying first passivation layer 130 and transparent conductive layer 110 constitute a first storage capacitance 141.

In FIG. 1C, a dielectric layer 150 is formed on the substrate 100.

In FIG. 1D, a second photo-mask is used to define the dielectric layer 150, the second metal layer 140 and the first passivation layer 130 simultaneously. The second photo-mask is a half-tone photo-mask. Because different regions of the half-tone photo-mask have different light transmittances, photo resist with different thicknesses on different regions is formed after exposure and development processes. After an etching process, several layers underlying the photo resist can be defined simultaneously. In the first embodiment, the photo resist has the highest thickness on a reflective portion of the pixel region B and regions outside the gate pad region D, second highest thickness on the gate pad 140d, and zero thickness on the penetrating portion of the pixel region B and regions surrounding the gate pad 140d. Because no photo resist is on the penetrating portion of the pixel region B and regions surrounding the gate pad 104d, the sacrifice metal layer 140b on the penetrating region of the pixel region B and a portion of the first passivation layer 130 surrounding the sacrifice metal layer are removed in the etching process, at the same time, the dielectric layer 150 and the first passivation layer 130 surrounding the gate pad 140d are also removed to expose the gate pad 140d. After the etching process, the dielectric layer 150 on the gate electrode 140a can be used as the gate isolation layer 150a. The dielectric layer 150 on the capacitance line 140c and the scan line (not shown) can be used to protect conducting wires and to provide electrical isolation for conducting wires.

In FIG. 1E, a semiconductor layer is formed on the substrate 100, and then a third photo-mask is used to define the semiconductor layer to form a channel region 160a on the dielectric layer 150 on the gate electrode 140a. In a preferred embodiment, the semiconductor layer comprises an amorphous silicon layer and an N-type doped amorphous silicon layer thereon.

The second photo-mask of FIG. 1D and the third photo-mask of FIG. 1E can be combined as a single half-tone photo-mask. First, a dielectric layer 150 and a semiconductor layer 160 are sequentially formed on the substrate 100. Then, a half-tone photo-mask is used to define the semiconductor layer 160, the dielectric layer 150, the second metal layer 140 and the first passivation layer 130 simultaneously. Therefore, the number of the photo-masks used in manufacturing the array substrate of a transflective LCD can further be reduced. After exposure and development processes, the photo resist has the highest thickness on the channel region 160a, second highest thickness on the gate pad 140d, zero thickness on the penetrating portion of the pixel region B and regions surrounding the gate pad 140d, and the photo resist on other regions has thickness between the thickness on the channel region 160a and the thickness on the gate pad 140d.

In FIG. 1F, a third metal layer 170 is formed on the substrate 100. Then, a fourth photo-mask is used to define the third metal layer 170 to form a source electrode 170a, a drain electrode 171a, an expanded gate pad 170d, a signal line (not shown) and a signal pad (not shown). The source electrode 170a and the drain electrode 171a are on two sides of the channel region 160a. The drain electrode 171a is electrically connected to the transparent conductive layer 110. The expanded gate pad 170d is directly connected to the gate pad 140d to reduce impedance of the gate pad 140d. The structure of the expanded gate pad 170d is similar to the structure of the signal pad. Therefore, an expanded signal pad with a structure similar to the gate pad 140d can be selectively formed under the signal pad to reduce impedance of the signal pad.

In FIG. 1G, a second passivation layer 180 is formed on the substrate 100. Then, the second passivation layer 180 is defined by back exposure to remove the second passivation layer 180 and the first passivation layer 130 on the penetrating portion of the pixel region B.

Second Embodiment

FIGS. 2A-2D are cross-section views of an array substrate of a transflective LCD in process steps according to the second embodiment. From the process step of forming the transparent conductive layer 110 to the process step of forming the dielectric layer 150, the second embodiment is the same as the first embodiment. Therefore, the description about these process steps can be directly referred to the first embodiment.

Figure 2A:
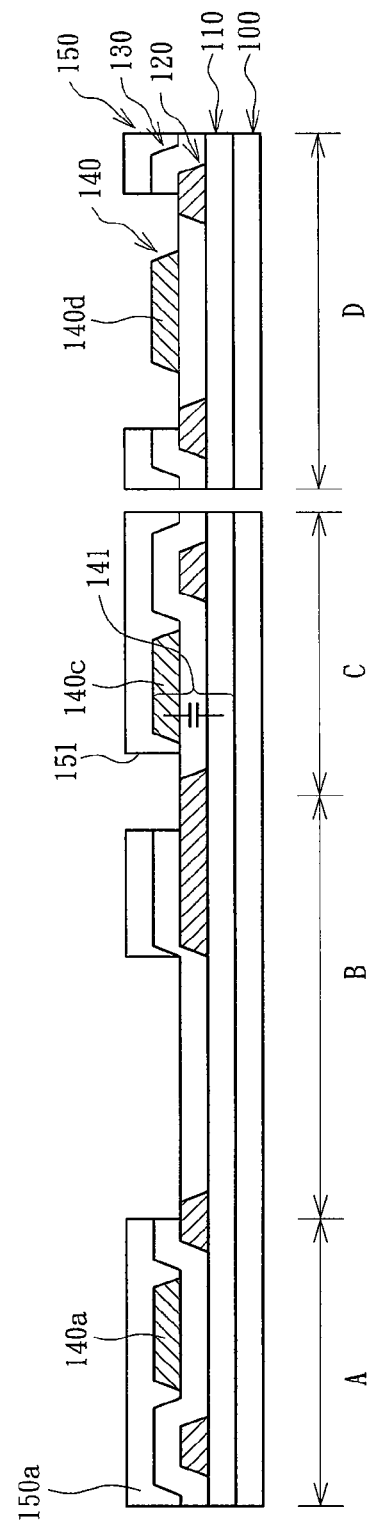
FIGS. 2A-2D are cross-section views of an array substrate of a transflective LCD in process steps according to the second embodiment.

In FIG. 2A, a second photo-mask is used to define the dielectric layer 150, the second metal layer 140 and the first passivation layer 130 after forming the dielectric layer 150. In this process step, the sacrifice metal layer 140b on the penetrating portion of the pixel region B and the dielectric layer 150 thereon are removed, at the same time, the dielectric layer 150 and the first passivation layer 130 on a side of the first storage capacitance 141 is removed to form a contact window 151. Moreover, the dielectric layer 150 and the first passivation layer 130 surrounding the gate pad 140d are removed to expose the gate pad 140d at the same time.

Figure 2B:
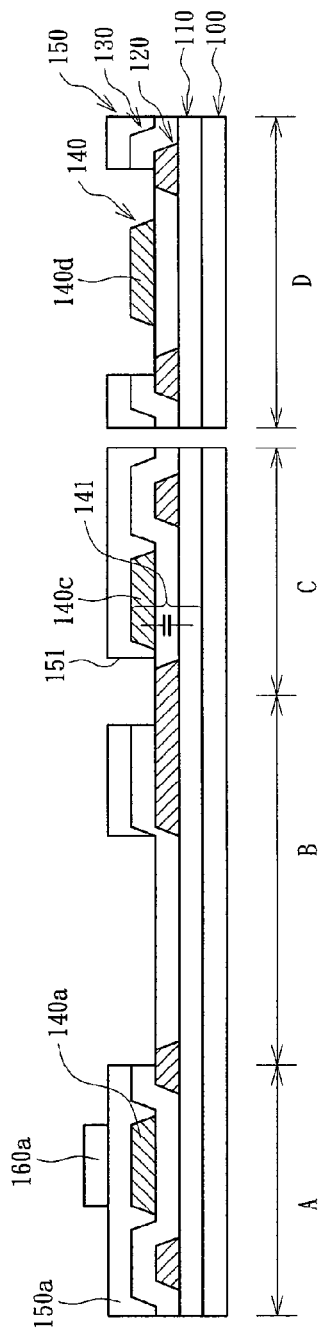

In FIG. 2B, a semiconductor layer is formed after forming the contact window 151. A third photo-mask is used to define the semiconductor layer to form a channel region 160a on the dielectric layer 150 on the gate electrode 140a. The same as the first embodiment, the second photo-mask of FIG. 2A and the third photo-mask of FIG. 2B can be combined as a single half-tone photo-mask. The half-tone photo-mask used here is very similar to the half-tone photo-mask in the first embodiment except the photo-mask of the second embodiment has a contact window pattern thereon.

Figure 2C:
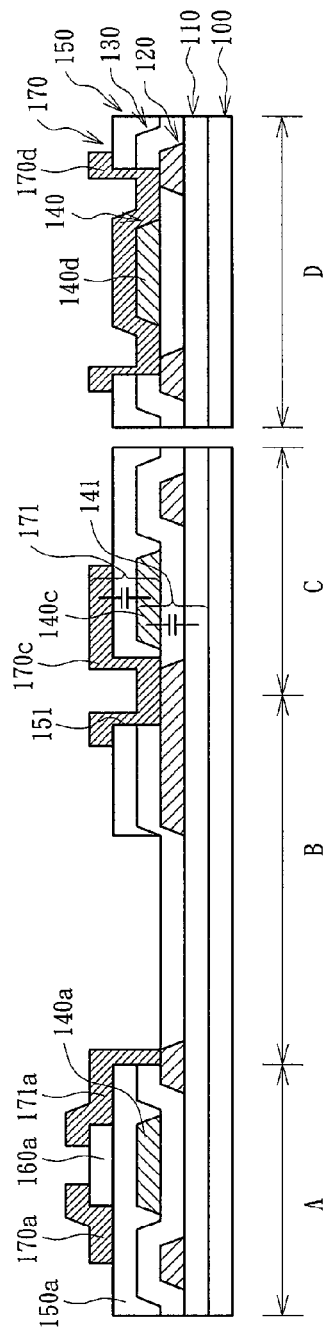

In FIG. 2C, a third metal layer 170 is formed on the substrate 100. A fourth photo-mask is used to define the third metal layer 170 to form a source electrode 170a, a drain electrode 171a, an expanded capacitance 170c, an expanded gate pad 170d, a signal line (not shown) and a signal pad (not shown). The source electrode 170a and the drain electrode 171a are on two sides of the channel region 160a. The drain electrode 171a is electrically connected to the transparent conductive layer 110. The expanded capacitance line 170c is on the dielectric layer 150 on the capacitance line 140c. The expanded capacitance line 170c is electrically connected to the transparent conductive layer 110 through the contact window 151. The expanded capacitance 170c, the underlying dielectric layer 150 and capacitance line 140c constitute a second storage capacitance 171. The second storage capacitance 171 and the first capacitance 141 connect in series, not only the capacitance value per unit of area can be increased but also the overall area on the substrate occupied by the storage capacitance can be reduced. Moreover, the aperture rate of the penetrating region of the pixel region and the brightness of the LCD are increased.

Figure 2D:
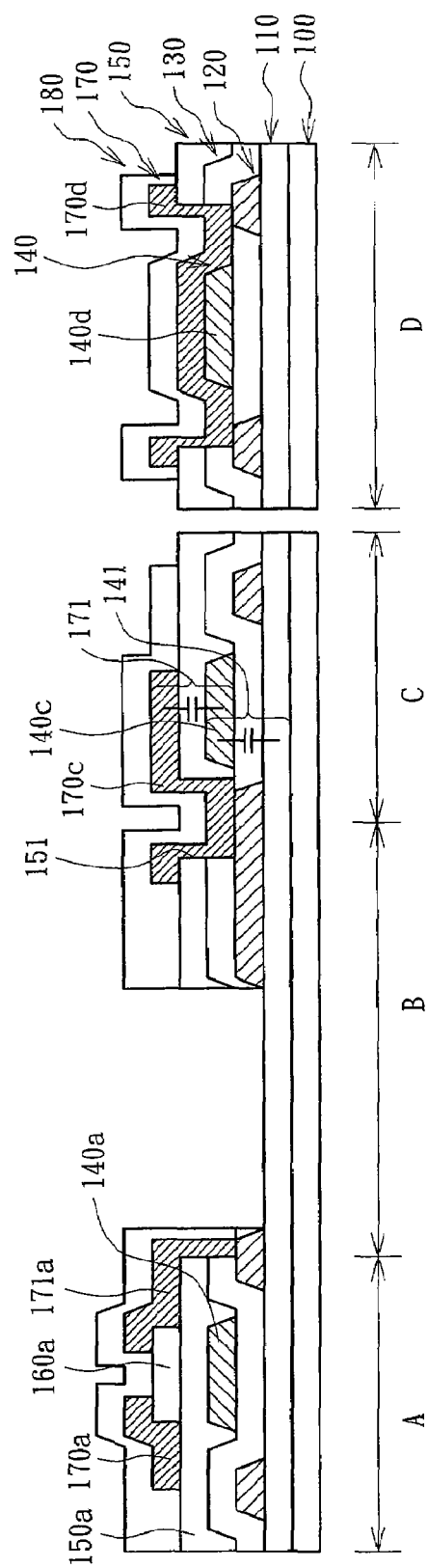

As shown in FIG. 2D, a second passivation layer 180 on the substrate 100 is formed. The second passivation layer 180 is defined by means of back exposure, and at the same time the second passivation layer 180 and the first passivation layer 130 on the penetrating region of the pixel region B are removed.

Accordingly, the present invention, as shown and described, has at least the following advantages.

(1) In preferred embodiments, only three to four photo-masks are needed to manufacture a transflective LCD. Therefore, not only the production cost can be greatly reduced but also the production volume can be increased.

(2) The gate pad and the expanded gate pad are directly connected to reduce impedance of the gate pad.

(3) The storage capacitances connect in series, not only the capacitance value per unit of area can be increased but also the overall area on the substrate occupied by the storage capacitance can be reduced. Moreover, the aperture rate of the penetrating region of the pixel region and the brightness of the LCD are increased.

The preferred embodiments of the present invention described above should not be regarded as limitations to the present invention. It will be apparent to those skilled in the art that various modifications and variations can be made to the present invention without departing from the scope or spirit of the invention, as defined in the appended claims.

What is claimed is:

1. A method of manufacturing an array substrate of a transflective liquid crystal display (LCD), comprising:
    sequentially forming a transparent conductive layer and a first metal layer on a substrate;
    defining the first metal layer and the transparent conductive layer to allow the first metal layer to form complementary patterns of a gate electrode, a first conducting wire, a capacitance line and a penetrating region of a pixel region, and to allow the transparent conductive layer to form a pixel electrode;
    sequentially forming a first passivation layer and a second metal layer on the substrate;
    defining the second metal layer to form the gate electrode, the first conducting wire and the capacitance line, wherein the capacitance line, and the first passivation layer and the transparent conductive layer constitute a storage capacitance;
    forming a dielectric layer on the substrate;
    removing the dielectric layer and the second metal layer on a penetrating region of the pixel region, the first passivation layer on sides of the penetrating region, and the dielectric layer and the first passivation layer surrounding an end of the first conductive line simultaneously;
    forming a channel region on the dielectric layer on the gate electrode;
    forming a third metal layer on the substrate; defining the third metal layer to form a second conductive line, a source electrode and a drain electrode, wherein the source electrode and the drain electrode are at two sides of the channel region, and the drain electrode is electrically connected to the transparent conductive layer;
    forming a second passivation layer on the substrate; and
    defining the second passivation layer and the first passivation layer to remove the second passivation layer and the first passivation layer on the penetrating region on the pixel region.

2. The method of claim 1, wherein the step of defining the first metal layer and the transparent conductive layer is performed by using a half-tone photo-mask.

3. The method of claim 1, wherein the second metal layer is defined by backward exposure.

4. The method of claim 1, wherein the step of removing the dielectric layer and the second metal layer on the penetrating region of the pixel region is performed by using a half-tone photo-mask.

5. The method of claim 1, wherein the second passivation layer and the first passivation layer are defined by backward exposure.

6. The method of claim 1, wherein the step of defining the third metal layer comprises forming an expanded gate pad on the end of the first conducting wire.

7. The method of claim 1, further comprising removing the dielectric layer and the first passivation layer on a side of the storage capacitance to form a contact window after the step of forming the dielectric layer.

8. The method of claim 7, wherein the step of defining the third metal layer comprises forming an expanded capacitance line on the dielectric layer on the capacitance line, and the expanded capacitance line is electrically connected to the transparent conductive layer through the contact window.

9. A method of manufacturing an array substrate of a transflective liquid crystal display (LCD), comprising:
- sequentially forming a transparent conductive layer and a first metal layer on a substrate;
- defining the first metal layer and the transparent conductive layer to allow the first metal layer to form complementary patterns of a gate electrode, a first conducting wire, a capacitance line and a penetrating region of a pixel region and to allow the transparent conductive layer to form a pixel electrode;
- sequentially forming a first passivation layer and a second metal layer on the substrate;
- defining the second metal layer to form the gate electrode, the first conducting wire and the capacitance line, wherein the capacitance line, and the first passivation layer and the transparent conductive layer constitute a storage capacitance;
- forming a dielectric layer and a semiconductor layer on the substrate;
- removing the semiconductor layer, the dielectric layer and the second metal layer on a penetrating region of the pixel region, the first passivation layer on sides of the penetrating region, the semiconductor layer, the dielectric layer and the first passivation layer surrounding an end of the first conducting line;
- forming a channel region on the dielectric layer on the gate electrode;
- forming a third metal layer on the substrate;
- defining the third metal layer to form a second conductive line, a source electrode and a drain electrode, wherein the source electrode and the drain electrode are at two sides of the channel region, and the drain electrode is electrically connected to the transparent conductive layer;
- forming a second passivation layer on the substrate; and
- defining the second passivation layer and the first passivation layer to remove the second passivation layer and the first passivation layer on the penetrating region on the pixel region.

10. The method of claim 9, wherein the step of defining the first metal layer and the transparent conductive layer is performed by using a half-tone photo-mask.

11. The method of claim 9, wherein the second metal layer is defined by backward exposure.

12. The method of claim 9, wherein the step of removing the semiconductor layer, the dielectric layer and the second metal layer on the penetrating region of the pixel region is performed by using a half-tone photo-mask.

13. The method of claim 9, wherein the second passivation layer and the first passivation layer are defined by backward exposure.

14. The method of claim 9, wherein the step of defining the third metal layer comprises forming an expanded gate pad on the end of the first conducting wire.

15. The method of claim 9, further comprising removing the dielectric layer and the first passivation layer on a side of the storage capacitance to form a contact window after the step of forming the dielectric layer and the semiconductor layer.

16. The method of claim 15, wherein the step of defining the third metal layer comprises forming an expanded capacitance line on the dielectric layer on the capacitance line, and the expanded capacitance line is electrically connected to the transparent conductive layer through the contact window.

* * * * *